United States Patent
Zakel

[19]

[11] Patent Number: 6,070,788
[45] Date of Patent: Jun. 6, 2000

[54] METHOD OF SOLDERING TERMINAL FACES, AS WELL AS A METHOD OF MANUFACTURING A SOLDER ALLOY

[75] Inventor: Elke Zakel, Falkensee, Germany

[73] Assignee: Fraunhofer-Gesellschaft zur Förderung der angewandten Forschung e.V., München, Germany

[21] Appl. No.: 08/809,538

[22] PCT Filed: Sep. 4, 1995

[86] PCT No.: PCT/DE95/01209

§ 371 Date: May 8, 1997

§ 102(e) Date: May 8, 1997

[87] PCT Pub. No.: WO96/08337

PCT Pub. Date: Mar. 21, 1996

[30] Foreign Application Priority Data

Sep. 15, 1994 [DE] Germany ............... 44 32 774

[51] Int. Cl.⁷ .................. B23K 1/20; H05K 3/34
[52] U.S. Cl. .............. 228/214; 164/47; 228/248.1; 228/234.1; 228/258
[58] Field of Search ............... 228/214, 248.1, 228/254, 258, 256, 234.1; 164/47

[56] References Cited

U.S. PATENT DOCUMENTS

| | | | |
|---|---|---|---|
| 3,110,100 | 11/1963 | Hill | 228/234.1 |
| 3,214,827 | 11/1965 | Phohofsky | 228/258 |
| 3,589,590 | 6/1971 | Fitzsimmons | 228/214 |
| 4,563,974 | 1/1986 | Price | 118/66 |
| 5,125,560 | 6/1992 | Degani et al. | |

FOREIGN PATENT DOCUMENTS

| | | |
|---|---|---|
| 0 463 297 | 1/1992 | European Pat. Off. |
| 2442180 | 3/1975 | Germany |
| 3110319 | 1/1982 | Germany |
| 3433844 | 4/1985 | Germany |
| 4216414 | 12/1993 | Germany |
| 9317139 | 4/1994 | Germany |
| 4127436 | 4/1992 | Japan |
| 825317 | 12/1959 | United Kingdom |
| WO 86/04002 | 7/1986 | WIPO |

OTHER PUBLICATIONS

*Welding Journal*, vol. 53, No. 7, Jul. 1974, Solder Fusing with Heated Liquids, pp. 498–509.

*Primary Examiner*—Patrick Ryan
*Assistant Examiner*—Lynne Edmondson
*Attorney, Agent, or Firm*—Darby & Darby

[57] ABSTRACT

A method of applying molten solder to connection surfaces on a substrate. The substrate, which has a surface which can be wetted with solder or at least one area which can be wetted while the rest cannot, is immersed in an organic liquid medium whose boiling point is the same as or above the melting point of the solder. Solder is applied to the surface or the area on the substrate where a terminal is to be formed to produce a solder bump, the quantity of solder to be placed on the connection surface is in the liquid medium, at least at the moment when it makes contact with the surface, and the temperature of the liquid medium is at or above the melting point of the solder.

16 Claims, 5 Drawing Sheets

FIG. 4a
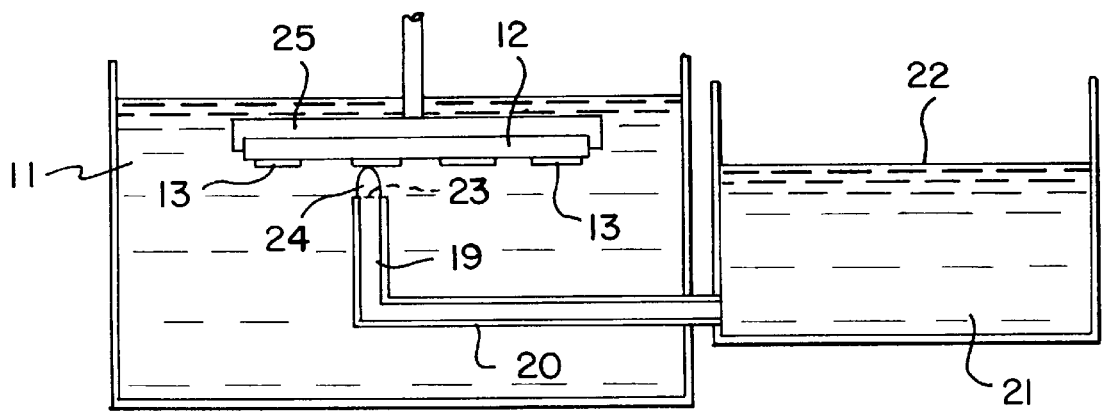
FIG. 4b
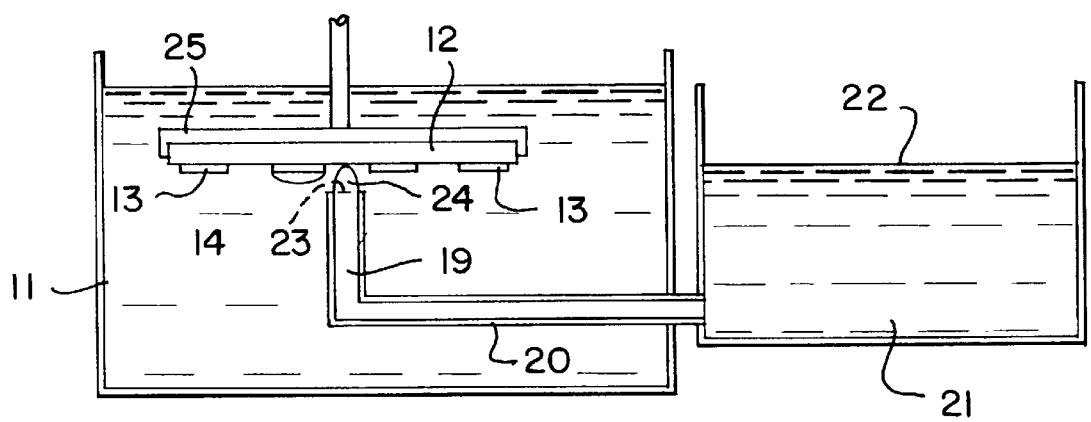
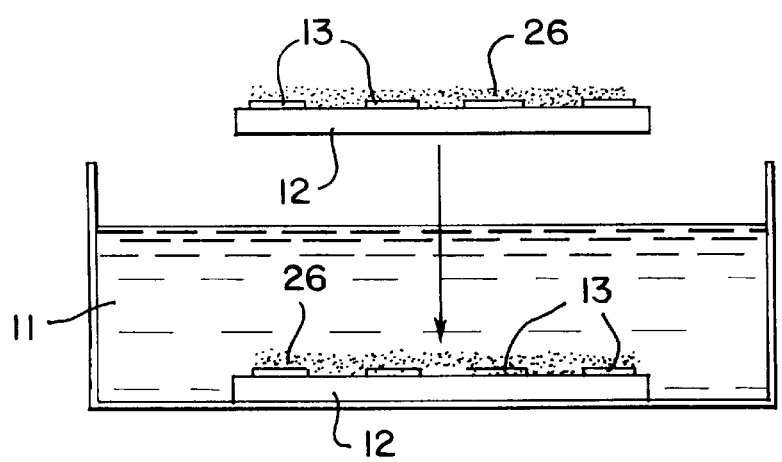
FIG. 5a

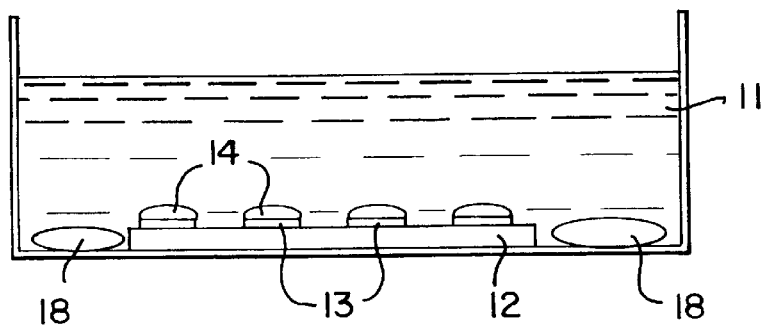
FIG. 5b
FIG. 6
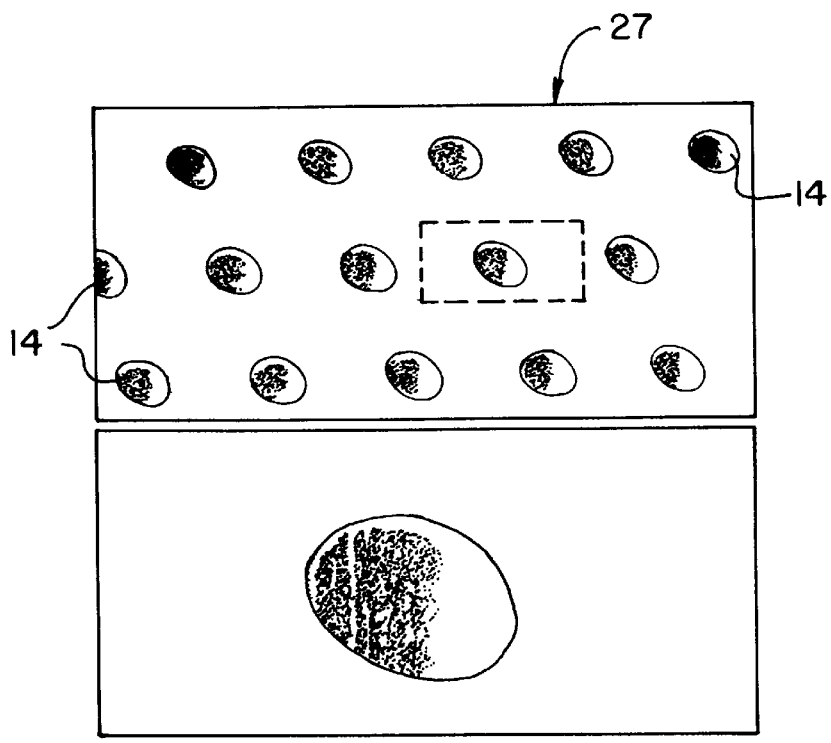
FIG. 7

METHOD OF SOLDERING TERMINAL FACES, AS WELL AS A METHOD OF MANUFACTURING A SOLDER ALLOY

BACKGROUND OF THE INVENTION

1. Field of the Invention

The present invention relates to a method of soldering terminal faces of a substrate using molten solder, as well as to a method of manufacturing a solder alloy of at least two solder components.

2. Description of the Related Art

The demands being imposed on the quality and reliability of soldered connections are constantly growing, not the least because of the increasing miniaturization of electronic components and the ever higher integration levels of ICs. Meeting said demands using the known, industrially applicable techniques requires a considerable outlay which is correspondingly reflected in manufacturing costs. Meanwhile, use of the solder paste technique in conjunction with the reflow method has become widespread. Here, in a first process, paste-like solder material is applied onto the terminal faces and, in a second process, the heat needed for the soldering reaction is introduced. In practice, a serious problem which is frequently encountered here is the introduction of the heat quantity needed for the reflow method in such a targeted and metered manner that, on the one hand, a solder application with as homogeneous a structure as possible is formed and, on the other hand, the occurrence of irreparable damage inside the electronic components as a result of overheating is avoided.

Furthermore, with the known reflow method, depending on the level of quality demanded of a soldered connection it is necessary to effect the method in an inert atmosphere, with the result that the costs merely of providing suitable operating equipment are extremely high.

The object of the present invention is to provide a method which enables the production of high-quality and reliable soldered connections with a substantially reduced outlay for equipment and a lower number of process steps and so allows such electronic components to be manufactured at a far lower cost.

SUMMARY OF THE INVENTION

The present invention is directed to a method of soldering terminal faces 13 of a substrate 12 using molten solder. Substrate 12, which is provided with a solder-wettable surface 13 or with an at least one wettable sub-surface of an otherwise non-wettable surface, is introduced into a liquid organic medium, which has a boiling temperature equal to or above the melting temperature of the solder. The solder is then applied onto the terminal face 13 in the form of a surface or sub-surface so as to form a solder bump 14. The solder quantity associated with the terminal face is situated, at least at the moment of wetting, inside the medium, and the temperature of the medium is equal to or above the melting temperature of the solder.

The method according to the invention enables the selective soldering of terminal faces of a substrate in an environment formed by a liquid, organic medium. The substrate may be any carrier material provided with one or more terminal faces, such as for example wafers, printed circuit boards, ceramic substrates etc. Both the solder application and the structural improvement of the applied solder, which is otherwise achieved with the known reflow method in a subsequent process, are effected in a single process. Firstly, such a method makes use of the advantageous effects of the liquid organic medium which, as tests have revealed, both acts reductively upon the surface to be wet and increases the wettability of the solder material. Secondly, tempering of the solder material by the liquid, organic medium enables a uniform, highly controllable heat input into the solder material. The result is a substantially homogeneous structural constitution in the solder application and a precisely adjustable diffusion depth between the solder application and the terminal face in order to achieve a soldered connection having the desired properties.

Compared to the conventional invention methods, which besides splitting the process into an application of solder paste and a subsequent reflow method require a heating device of a—particularly in terms of hardware—complex design for regulating the temperature during the reflow method, in the method according to the invention the heat input along with tempering of the medium may be determined in a simple manner by the retention time in the medium. It is then also possible to avoid overheating effects by dividing the retention time into a plurality of phases, between which there is a separation of the medium from the terminal face provided with the solder application. By these means it also becomes possible to deposit different materials as solder layers one on top of the other and build up layered solder bumps. Because of the precisely adjustable and hence improved quality of the soldered connection, the method according to the invention enables soldering to be effected with a substantially reduced outlay for equipment.

In the method according to the invention, selective soldering is made possible by dividing the surface of the substrate into wettable and non-wettable sub-surfaces so that there is adhesion of the solder material only on the wettable surfaces, otherwise the solder material in the medium is repelled by the non-wettable sub-surfaces. The respective wettability of the sub-surfaces may be adjusted, for example by means of a suitable surface design. By way of example, a differentiation between wettable and non-wettable subsurfaces may be achieved by applying solder resist onto the substrate surface while leaving wettable metal sub-surfaces exposed. Furthermore, the person skilled in the art may use other known techniques for achieving such a differentiation between wettable and non-wettable sub-surfaces such as, for example, the mask application of a passivator. It is 'at any rate' to be stressed that, as a whole, mask-like fashioning of the substrate surface with so-called "small pool formation", whereby discrete indentations for receiving the solder material are created in the region of the terminal faces, is not necessary for effecting the method according to the invention. Rather, the method according to the invention utilizes the fact that, upon wetting of the wettable sub-surfaces with solder material in the medium, because of the surface tension of the solder material meniscus-like bulges are formed which make an indentation in the substrate surface superfluous.

In a possible embodiment of the method according to the invention, for forming the solder bump, the solder is provided as a solder pool in a bath formed by the medium. The application of the solder onto the terminal faces is then effected by an at least partial lowering of the substrate into the solder pool and a subsequent lifting of the substrate out of the solder pool. During said process, as explained above, wetting of the wettable terminal faces is effected, the solder material being repelled by the other non-wettable surface regions of the substrate surface upon removal of the substrate from the solder pool. Because of the adhesive forces developing between the solder and the terminal faces upon wetting of the wettable terminal faces, this embodiment of the method may be effected with any orientation of the terminal faces, e.g. upwardly or downwardly directed terminal faces. Owing to the combination of a medium bath with a solder pool contained therein, this embodiment requires only a minimal outlay for equipment.

In another embodiment the solder is disposed as a solder layer on a solder screen inside the medium and above the substrate. The application of the solder onto the terminal faces is effected in a sedimentary manner by means of a screen discharge consisting of solder particles. The sedimentary precipitation of the solder particles on the terminal faces also enables a wetting of irregular, fissured surfaces, especially in indentations of the surface.

In an embodiment advantageous for selective soldering, the solder is disposed inside the medium as a solder column in a capillary fed from a solder reservoir, and the application of the solder onto the terminal faces is effected by means of a meniscus formed at the capillary outlet. Soldering of the terminal faces is possible by regulating the pressure exerted by the solder reservoir upon the solder column, to determine the size of the meniscus and hence the size of the solder application on the terminal faces. Given a controlled relative movement between the capillary and the substrate surface, the capillary may be used as a "solder pencil", thereby enabling the formation of solder bumps at any discrete points on the substrate surface. The "solder pencil" method may be realized in a particularly simple manner when the substrate is moved in a plane perpendicular to the capillary axis.

A further possible way of achieving the stated object is by means of a further method which is an alternative to the method described above. Like the method described above, the alternative method described below also makes use of the advantageous effects which arise with use of a liquid, organic medium as a soldering environment.

In the further method according to the invention, unlike in the method previously described, the application of a solder layer which substantially covers the substrate surface is effected prior to the introduction of the substrate into the liquid organic medium. The substrate is then introduced together with the solder application into the medium, which has a boiling temperature above the melting temperature of the solder application and is at least temporarily heated up to a temperature above the melting temperature of the solder application.

The alternative method according to the invention described above offers the possibility of using, as a solder application, standard solder materials such as, for example, a solder particle layer, which prior to introduction of the substrate into the medium is applied onto substantially all of the substrate surface, or a solder film.

In addition to the above-mentioned alternative methods, the principle according to the invention, namely to use a liquid organic medium as a solder environment when processing solder material, may also be applied when melting solder alloys.

By applying the basic principle according to the invention it is possible to manufacture a solder alloy of at least two solder components, which in terms of its composition is precisely adjustable. A bath of the organic medium, which has a boiling temperature above the melting temperature of the solder components, is tempered to a temperature which is equal to or greater than the melting temperature of the highest-melting solder component. The introduction of the solder components into the medium may be effected in a solid to molten state.

As in the soldering methods according to the invention described above, the medium in a simple manner creates an inert environment which enables a remelting of the solder components into an alloy in a reductive environment. The heat input needed for remelting is effected via the medium. The composition of alloys melted in this manner corresponds precisely to the composition of the solder material introduced into the medium bath.

Unlike the conventional alloy methods, such as the galvanic methods, evaporation coating or sputtering, the final composition of the solder bumps is not dependent upon changing convection conditions or differing local current densities.

Thus, in a relatively simple manner the remelting method according to the invention enables the formation of binary, ternary or more complex, in particular lead-free solder alloys, the composition of which is precisely adjustable. In particular, by tempering of the medium to boiling temperature it is ensured that there is a homogeneous temperature distribution in the bath, resulting in the formation of a correspondingly fine-grained, homogeneous structure of the solder alloy. The boiling temperature of the bath is also reliably adjustable, in that energy is supplied continuously to the bath so that, by virtue of a stationary evaporation of the medium, a self-limiting system is adjusted.

Irrespective of whether the common solution principle underlying the invention, namely the use of an organic, liquid medium as a solder environment during solder processing, is used with the soldering method or with the remelting process described above, the use of glycerol as a medium has proved particularly advantageous. The processing or production of tin-lead solder alloys or gold-tin solder alloys in glycerol as a medium has also produced particularly good results. This applies both to eutectic and to quasi eutectic alloys having a melting temperature between 183° C. and 290° C., with glycerol having a boiling temperature of approximately 290° C. Other liquid organic substances, such as mineral oil or paraffin, may alternatively be used as a medium. What is crucial for the use of a specific substance as a medium is the fact that the soldering temperature of the medium is equal to or above the melting temperature of the highest-melting solder component. Accordingly, it is particularly advantageous to tune the pairing of solder components and medium in a suitable manner to one another.

BRIEF DESCRIPTION OF THE DRAWING

There follows a detailed description, with reference to the drawings, of embodiments of the methods according to the invention of soldering terminal faces. The drawings show:

FIGS. 4a–4b show a fourth embodiment of the method of soldering substrate terminal faces;

FIGS. 5a–5b show a fifth embodiment of the method of soldering substrate terminal faces;

FIG. 6 is a solder bump distribution produced on a substrate surface by the fourth embodiment of the method; and FIG. 7 is a cross-sectional view of a solder bump of the solder bump distribution in FIG 7.

DETAILED DESCRIPTION OF THE PRESENTLY PREFERRED EMBODIMENTS

Figure 1A:
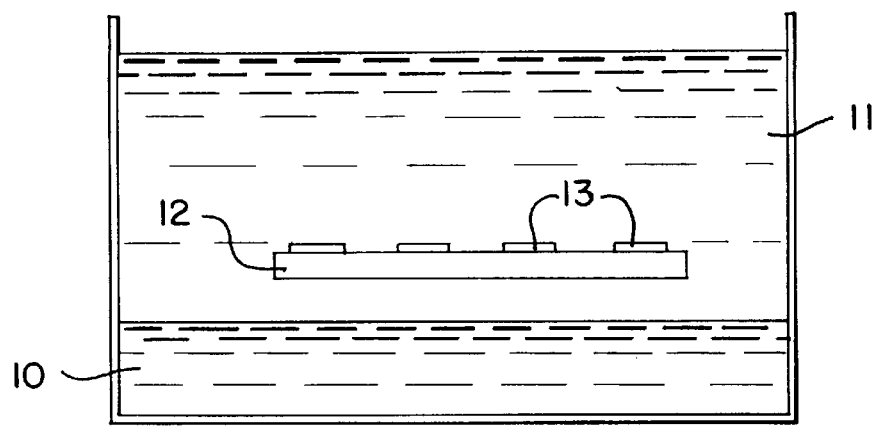
FIGS. 1a–1c show a first embodiment of the method of soldering substrate terminal faces.
Figure 1B:
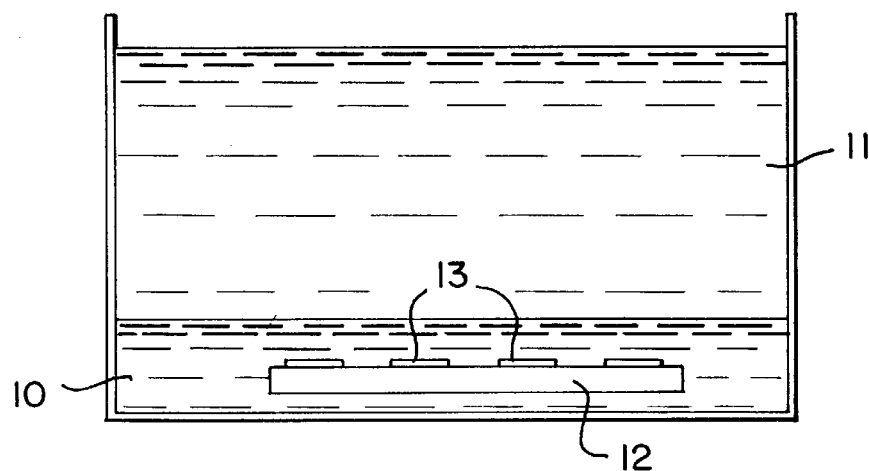
Figure 1C:
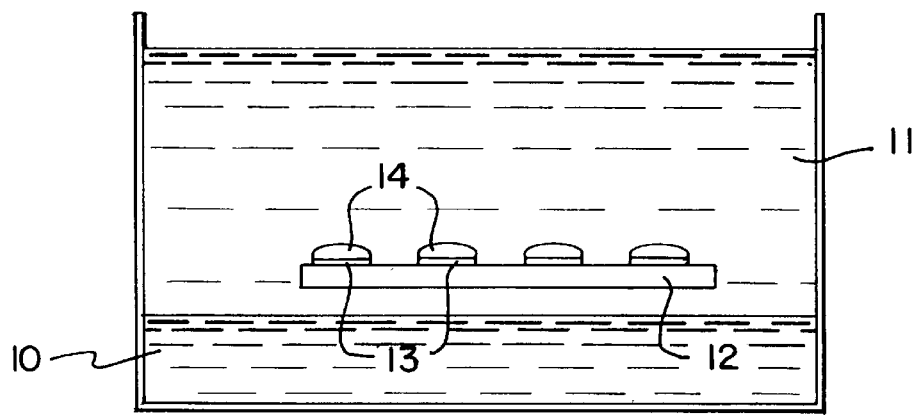

FIGS. 1a–1c show, by way of example, a first embodiment of the method, in which a solder pool 10 of a tin-lead (SnPb) alloy is disposed in a bath 11 of glycerol. Situated above the solder pool 10 in the bath 11 is a substrate 12, the surface of which is provided with a plurality of wettable areas which are hereinafter referred to as pads 13 (FIG. 1a). The bath 11 is heated to a temperature above the melting temperature of the solder, which in the present case is approximately 183° C.

For wetting the pads 13, the substrate 12 is lowered into the solder pool 10 (FIG. 1b) and then lifted back out of the solder pool 10 (FIG. 1c).

The view according to FIG. 1c clearly shows that, after lifting of the substrate 12 out of the solder pool 10, a solder application is left only on the pads 13 so as to form solder bumps 14, the solder having being repelled by the other surface regions of the substrate 12 and returned to the solder pool 10.

The solder bumps 14 have a uniform size and shape, which is in the manner of a liquid meniscus and is determined substantially by the viscosity of the molten solder material and its adhesion on the pads 13.

Besides a tin-lead alloy, other examples of possible solder alloys which may be used with the method as well as with the variants of the method described below are gold-tin, indium-tin, indium-lead, and tin-silver alloys, or chemically pure solder materials such as tin or indium.

Figure 2A:
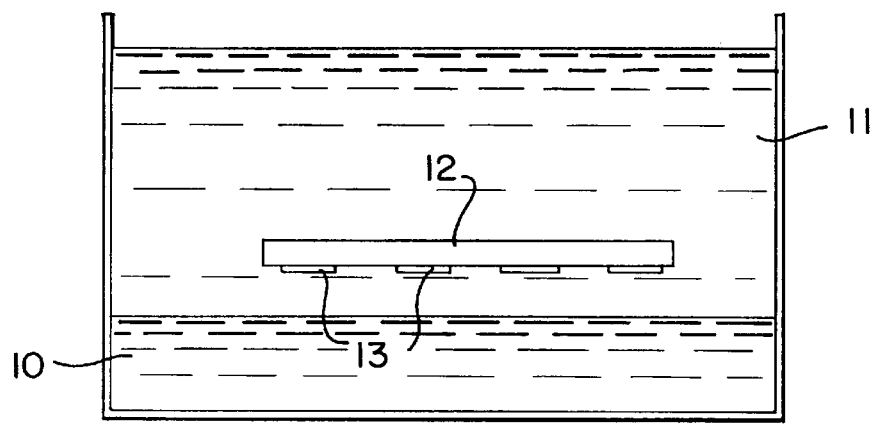
FIGS. 2a–2c show a second embodiment of the method of soldering substrate terminal faces.
Figure 2B:
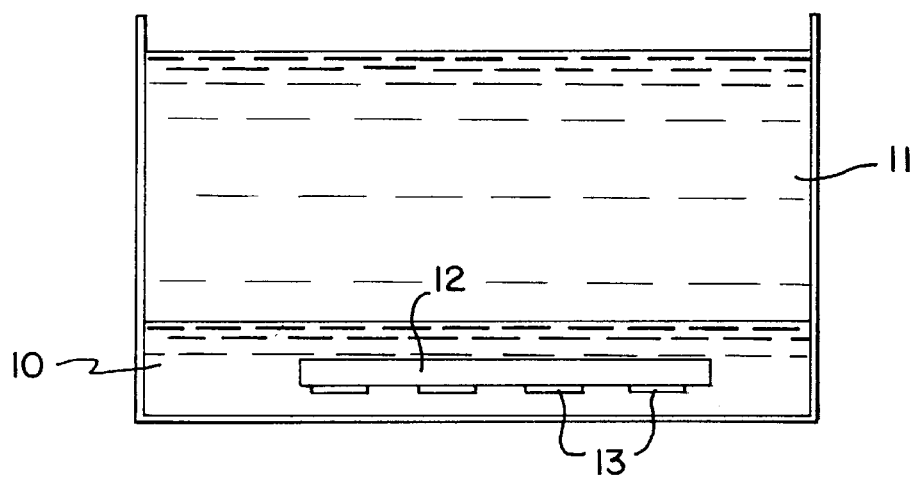
Figure 2C:
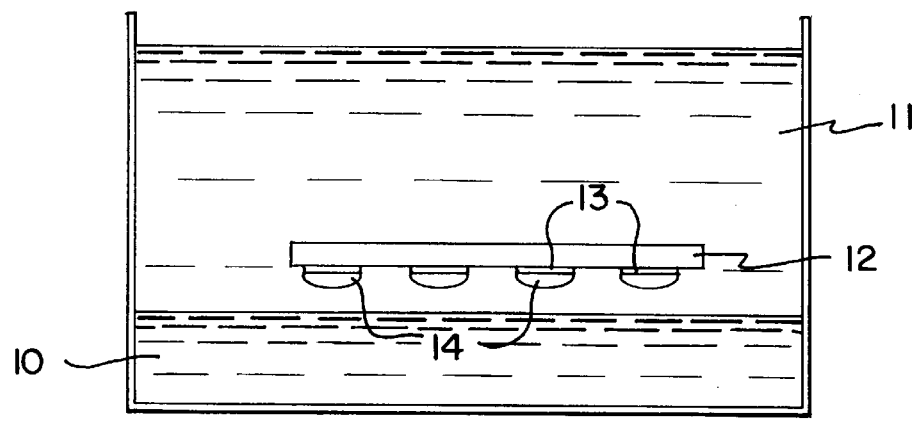

The only difference between the second embodiment of the method shown in FIGS. 2a to 2c and the first embodiment of the method shown in FIGS. 1a to 1c is that the substrate 12 is lowered with its pads 13 directed downwards into the solder pool 10. The results achieved, in terms of the construction of the resultant solder bumps 14, are substantially identical to the results achieved using the first variant of the method.

Figure 3A:
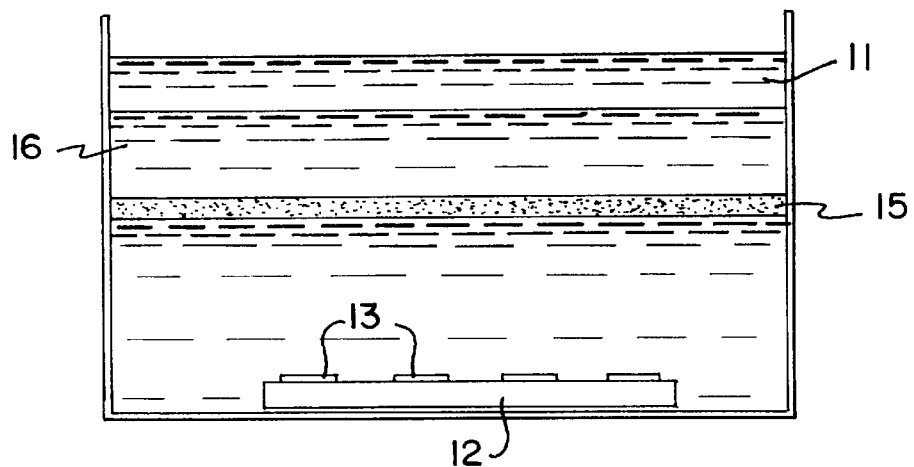
FIGS. 3a–3c show a third embodiment of the method of soldering substrate terminal faces.
Figure 3B:
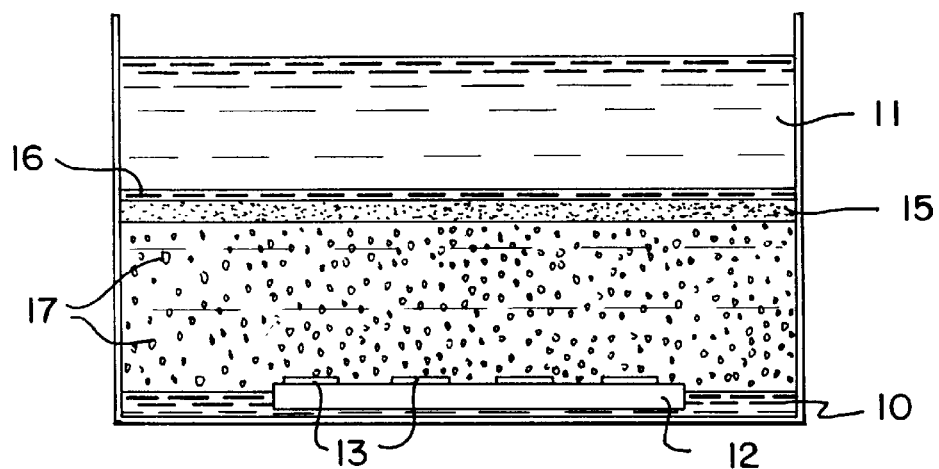
Figure 3C:
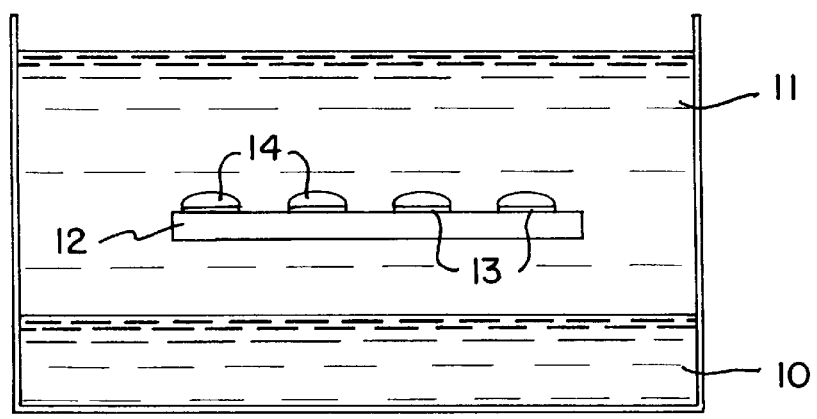

FIGS. 3a to 3c illustrate a third embodiment of the method, in which a solder layer 16 is disposed on a solder screen 15 in the bath 11, which is tempered to a temperature above the melting temperature of the highest-melting solder component. By means of a plunger (not shown in detail here) or simply through the influence of gravity, a screen discharge consisting of solder particles 17 passes through the bath 11 onto the surface of a substrate 12 disposed below the solder screen 15 in the bath 11 (FIG. 3b). While the screen discharge consisting of the solder particles 17 is moving through the medium towards the substrate 12, the latter may be moved in the opposite direction or remain stationary in the bath 11. In either case, sediment-like deposits of the solder particles 17 on the pads 13 produce a solder application which forms the solder bumps 14.

When the substrate 12 is moved upwards during the downward movement of the screen discharge, there is from the outset a precipitation of the solder particles 17 only in the region of the pads 13, the solder particles 17 in the remaining regions however being, as it were, washed down from the surface of the substrate 12. When the substrate 12 remains at the bottom 18 of the bath 11 during the downward movement of the solder particles 17, a layer (not shown in detail) of solder particles 17 forms over the entire surface of the substrate 12, the solder bumps 14 being formed only on the pads 13 and the solder particle layer in the remaining surface regions being washed off during an upward movement of the substrate 12 in the bath 11. In either case, the result is once again the formation of meniscus-shaped solder bumps 14.

FIGS. 4a and 4b finally show a fourth embodiment for soldering substrate terminal faces, in which the soldering material is disposed as a solder column 19 in a capillary 20 in the bath 11. The capillary 20 is in fluid connection with a solder reservoir 21, the level 22 of which is variable in order to adjust the capillary pressure. Depending on the height of the capillary pressure and the size of the capillary cross section at the capillary outlet 23, a liquid meniscus 24 is formed there.

Situated above the capillary outlet 23 in the tempered bath 11 is the substrate 12, which has its pads 13 directed towards the capillary outlet 23. The substrate 12 is positioned in the bath 11 by means of a substrate holding device 25 which is movable in a plane perpendicular to the longitudinal extension of the capillary 20 and in longitudinal extension of the capillary 20. To form solder bumps 14, the substrate 12 with the pads 13 is moved by means of the substrate holding device 25 in such a manner past the liquid meniscus 24 formed at the capillary outlet 23 that a wetting of the pads 13 is effected.

When the surface of the substrate 12 excluding the pads 13 is provided with a non-wettable coating or the like, to form the solder bumps 14 the substrate 12 may simply be moved linearly past the liquid meniscus 24, a wetting being effected only at the wettable pads 13. During said process, the level 22 of the solder reservoir 21 is readjusted in such a way that at the capillary outlet 23 the desired liquid meniscus 24 is provided for each pad 13.

The method shown in FIGS. 4a and 4b is advantageous in that selective soldering of specific pads 13 may be effected by superimposing, on the linear movement of the substrate holding device 25 directed at right angles to the longitudinal extension of the capillary 20, a lifting movement in such a way that only a wetting of selected pads 13 is effected by the surface meniscus 24. The capillary 20 shown in FIGS. 4a to 4b therefore enables a type of "solder pencil function".

FIGS. 5a and 5b show an embodiment of the method of soldering substrate terminal faces, in which, prior to introduction of the substrate 12 into the bath 11, substantially the entire substrate surface is covered with a coating of solid solder particles 26.

After coating of the surface of the substrate 12, the latter together with the solder particles 26 disposed thereon is immersed into the tempered bath 11 and remains there until solder bumps 14 form as a result of a so-called "solder reflow" in the region of the pads 13, while at the same time in the remaining surface regions of the substrate 12 the melted solder particles are repelled and collect at the bottom 113 of the bath 11.

FIG. 6 shows in a plan view the surface of a substrate 12 having a solder bump distribution 27 of individual, meniscus-like solder bumps 14, which have been formed by wetting on the—in the present example, circular—pads which are not shown in detail here.

As the cross-sectional view of FIG. 7 clearly reveals, the solder bumps 14 are formed like caps on the pads 13. The sectional view illustrated here shows, for example, a solder bump 14 of a tin-lead alloy (SnPb 63/37) on a pad 13 of nickel. In the example, the substrate comprises a semiconductor and the pads comprise autocatalytically deposited nickel.

What is particularly striking in the view according to FIG. 6, which like FIG. 7 reproduces an electron micrograph, is that the solder bumps 14 applied onto the pads 13 in the wetting process in an environment of an organic liquid medium, in the present case, glycerol, are of a particularly uniform construction.

I claim:

1. A method of selectively soldering terminal faces of a substrate having at least one solder-wettable terminal face on an otherwise non-wettable surface, comprising the steps of:

introducing the substrate into a tempered, liquid, organic medium; and applying a solder material inside the medium onto the substrate to form at the at least one solder-wettable terminal face at least one solder bump having a shape and arrangement determined by wettability of the substrate surface and interfacial properties of the medium.

2. A method according to claim 1, wherein the medium is glycerol.

3. A method according to claim 1, wherein the solder material is a solder pool in a bath of the medium.

4. A method according to claim 3, wherein said applying step comprises:

at least partial lowering of the substrate into the solder pool; and removing the substrate from the solder pool.

5. A method according to claim 1, wherein the solder is disposed as a solder layer on a scolder screen inside the medium and above the substrate.

6. A method according to claim 5, wherein said applying step comprises discharging solder particles through the solder screen onto the substrate as sediment.

7. A method according to claim 1, wherein the solder is disposed inside the medium as a solder column formed by a capillary fed from a solder reservoir.

8. A method according to claim 7, wherein said applying step comprises forming a liquid meniscus at an outlet of the capillary.

9. A method according to claim 8, wherein said applying step comprises moving the substrate in a plane perpendicular to a longitudinal extension of the capillary for soldering a plurality of terminal faces of the substrate.

10. A method of selectively soldering terminal faces of a substrate having at least one solder-wettable terminal face on an otherwise non-wettable substrate surface, comprising the steps of:

substantially covering the entire surface of the substrate with a solder application;

introducing the substrate together with the solder application into a tempered, liquid, organic medium; and applying a solder material inside the medium onto the substrate to form at the at least one solder-wettable terminal face at least one solder bump having a shape and arrangement determined by wettability of the substrate surface and interfacial properties of the medium.

11. A method according to claim 10, wherein the medium is glycerol.

12. A method according to claim 10, wherein the applied solder is a layer of solid solder particles.

13. A method according to claim 10, wherein the applied solder is a solder film.

14. A method of manufacturing a solder alloy of at least two solder components comprising the steps of:

tempering a bath of an organic medium having a boiling temperature greater than or equal to a melting temperature than a highest-melting solder component of the at least two solder components, up to a temperature greater than or equal to a solder melting temperature of the highest-melting solder component of the at least two solder component; and introducing the solder components in solid to molten state into the medium to form the solder alloy.

15. A method according to claim 14, wherein the medium, at least during formation of the alloy, is substantially maintained at boiling temperature.

16. A method according to claim 14, wherein the medium is glycerol.

* * * * *